United States Patent [19]

Jeuch

[11] Patent Number: 4,541,892

[45] Date of Patent: Sep. 17, 1985

[54] PROCESS FOR THE POSITIONING OF AN INTERCONNECTION LINE ON AN ELECTRICAL CONTACT HOLE OF AN INTEGRATED CIRCUIT

[75] Inventor: Pierre Jeuch, Seyssins, France

[73] Assignee: Commissariat a l'Energie Atomique, Paris, France

[21] Appl. No.: 639,587

[22] Filed: Aug. 10, 1984

[30] Foreign Application Priority Data

Aug. 12, 1983 [FR] France ................ 83 13282

[51] Int. Cl.$^4$ ................ C23F 1/02; B44C 1/22; C03C 15/00; C03C 25/06

[52] U.S. Cl. ................ 156/643; 29/591; 156/644; 156/646; 156/653; 156/656; 156/657; 156/659.1; 156/661.1; 156/904; 204/192 E; 357/65; 427/38; 427/88; 430/317; 430/318

[58] Field of Search ........ 156/643, 644, 646, 652, 156/653, 655, 656, 657, 659.1, 661.1, 662, 904; 204/192 E, 192 EC; 427/38, 39, 88; 430/313, 317, 318; 252/79.1; 29/580, 591; 357/65, 68, 69

[56] References Cited

U.S. PATENT DOCUMENTS

| 4,076,860 | 2/1978 | Kuroda ................ 156/656 X |
| 4,244,799 | 1/1981 | Fraser et al. ................ 156/656 X |
| 4,288,283 | 9/1981 | Umezaki et al. ................ 156/661.1 X |
| 4,473,437 | 9/1984 | Higashikawa et al. ................ 156/643 |
| 4,478,679 | 10/1984 | Chang et al. ................ 156/657 X |

FOREIGN PATENT DOCUMENTS

| 0049400 | 4/1982 | European Pat. Off. . |
| 0071010 | 2/1983 | European Pat. Off. . |
| 2321190 | 3/1977 | France . |
| 2428915 | 1/1980 | France . |

OTHER PUBLICATIONS

IBM Technical Disclosure Bulletin, vol. 13, No. 1, Jun. 1970, p. 38, Anti-Interference Phenomena Coating, H. A. Khoury et al.

Primary Examiner—William A. Powell
Attorney, Agent, or Firm—Cesari and McKenna

[57] ABSTRACT

An improvement to the process for positioning an interconnection line on an electrical contact hole of an integrated circuit, according to which between a photosensitive coating and an insulating coating is interposed an intermediate anti-reflecting coating made e.g. from $SiO_2$ or amorphous silicon. The $SiO_2$ intermediate coating, etched after irradiation of the photosensitive material coating, is used as a mask for reactive ionic etching of the insulating coating. Thus, the image of the photosensitive material coating is transferred to the thick insulating material coating. This process is useful especially in the production of integrated circuits.

5 Claims, 6 Drawing Figures

PROCESS FOR THE POSITIONING OF AN INTERCONNECTION LINE ON AN ELECTRICAL CONTACT HOLE OF AN INTEGRATED CIRCUIT

BACKGROUND OF THE INVENTION

The present invention relates to an improvement to a process for positioning an interconnection line on an electrical contact hole of an integrated circuit described in French patent application No. 2525389, filed on Apr. 14th 1982 in the name of C.E.A.

The process described in the aforementioned patent application is a process for positioning an interconnection line on an electrical contact hole of an integrated circuit where, after producing the electrical contact hole, the following stages are successively performed:
  deposition of a conductive coating on to the complete integrated circuit and the interconnection line is produced thereon,
  depositing on the conductive coating of an insulating coating obliterating the relief thereof and providing a planar surface,
  etching the insulating coating, so that insulant is only left behind at the location of the electrical contact hole,
  deposition of a resin layer on the integrated circuit, so as to mask the interconnection line to be produced,
  etching part of the conductive coating, which is free from resin and the remaining insulating coating, and,
  elimination of the remaining insulating coating and the resin layer.

According to a preferred embodiment of this process, the insulating coating is a resin coating.

This process, which permits an autopositioning of the interconnected line on the electrical contact hole suffers from the disadvantage that the accuracy of producing the etches of the conductive lines is not very high.

Thus, in the aforementioned process, the image of the interconnections are produced in the photosensitive resin layer according to standard photolithography processes. The reflecting nature of the coating to be etched (metallic coating) produces interferences in the photosensitive resin layer, which deteriorates the quality of the image of the interconnections and more particularly produces line width variations during the operating passages.

SUMMARY OF THE INVENTION

The present invention relates to a process which obviates these disadvantages by providing between the photosensitive coating and the insulating coating an intermediate coating preferably formed from silica ($SiO_2$) or an amorphous silicon.

The present invention therefore relates to a process for the positioning of an interconnection line on an electrical contact hole of an integrated circuit, wherein, after producing the electrical contact hole, the following successive stages are performed:
  deposition on the complete integrated circuit of a conductive coating, in which the interconnection line will be produced,
  deposition on the conductive coating of an insulating coating obliterating the relief thereof and having a planar surface,
  deposition of a coating of non-reflecting material on the insulating coating,
  deposition of a photosensitive resin coating on the intermediate coating and production of the image of the interconnection line to be produced in said resin coating,
  etching the non-reflecting, mask-free region of the material coating,
  elimination of the mask and etching the insulating coating of the regions not protected by the intermediate coating, the latter being stopped as soon as the region of the conductive coating located outside the contact hole is exposed,
  etching that part of the conductive coating free from the insulating coating, and
  elimination of the insulating coating and the remaining non-reflecting material.

According to a preferred embodiment of the process according to the invention, the etching of the non-reflecting material coating is a reactive ionic etching.

According to another preferred embodiment of the process according to the invention, the non-reflecting material coating is of silica.

According to another preferred embodiment of the process according to the invention, the non-reflective material coating is of amorphous silicon.

According to another preferred embodiment of the process according to the invention, the elimination of the mask and the etching of the insulating coating is carried out by oxygen-based reactive ionic etching.

BRIEF DESCRIPTION OF THE DRAWINGS

The invention is described in greater detail hereinafter relative to non-limitative embodiments and with reference to the attached drawing, wherein show.

DETAILED DESCRIPTION OF THE PREFERRED EMBODIMENTS

Figure 1:
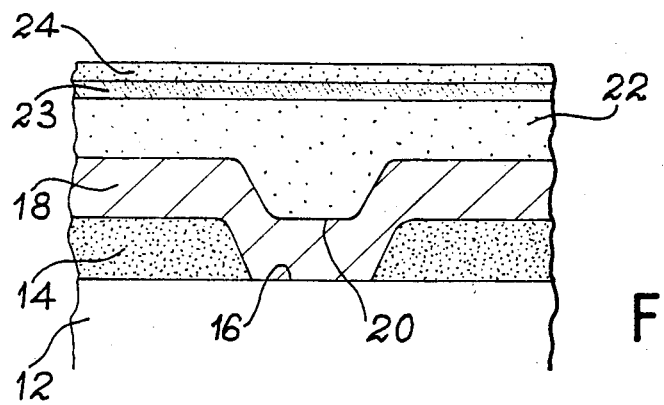
FIGS. 1 to 6 diagrammatically, the different stages of the process according to the invention.

FIG. 1 shows part of an integrated circuit having a doped semiconducting active zone 12, corresponding e.g. to the source or drain of a MOS transistor, which it is wished to electrically connect to another, active zone of the integrated circuit. Conventionally, active zone 12 is covered with an insulating coating 14, which is generally of silica and which can contain 5 to 10% phosphorus. For example, the thickness of the silica coating is 0.8 micron. This silica coating 14 is then etched, using a resin mask produced by photolithography on said coating, e.g. by chemical etching using dilute HF, so as to produce the electrical contact hole 16 of the active zone 12.

After producing the electrical contact hole 16, a conductive coating 18, preferably of aluminium, is deposited in per se known manner on the complete integrated circuit, e.g. by the procedure of deposition by magnetron sputtering. This conductive coating 18, which has a constant thickness of e.g. approximately 1 micron, has a profile which is dependent on the underlying coatings, and has in particular a cavity 20 level with the electrical contact hole 16.

According to a preferred embodiment of the invention, an insulating coating 22 is deposited in conventional manner on the complete conductive coating 18, so that it has a planar surface. This insulating coating is preferably of resin, of the type used at present in photolithography. In the case of a resin insulating coating, the latter can be deposited by centrifuging according to the method conventionally used for depositing photosensitive resins in photolithography operations (so-called whirler process). As a function of the viscosity of the resin used, a heat treatment is advantageously carried out following deposition of the resin at a temperature making it possible to obtain a maximum flat surface due to the flow of said resin coating 22. A photosensitive resin could, for example, be heated to a temperature of 150° to 200° C.

After producing the resin coating 22, on to it is deposited a coating 23 of a non-reflecting material, preferably $SiO_2$ or amorphous silicon with a thickness of e.g. 0.1 to 0.2 $\mu$m.

A coating 24 of a photosensitive resin with a thickness of approximately 0.2 to 0.5 $\mu$m is then deposited on the coating of non-reflecting material 23.

This photosensitive coating makes it possible to very faithfully produce a mask, because it is not very thick and is deposited on a flat surface formed by a substrate, which is a poor optical reflector. The latter makes it possible to obviate the formation of optical interferences, which are responsible for a reduction of the optical resolution.

Figure 2:
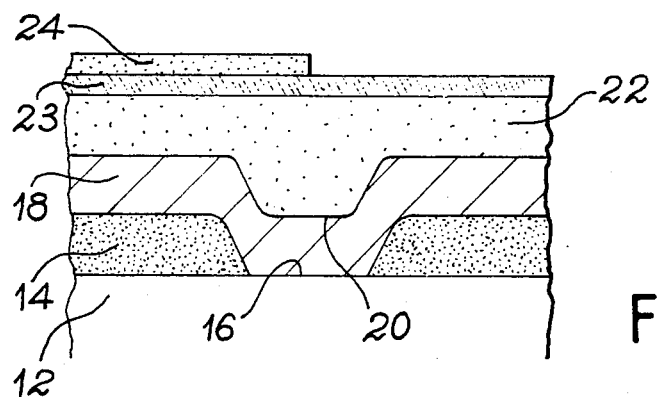

As shown in FIG. 2, the following stage of the positioning process consists of producing the image of the interconnection line in the photosensitive resin coating.

Figure 3:
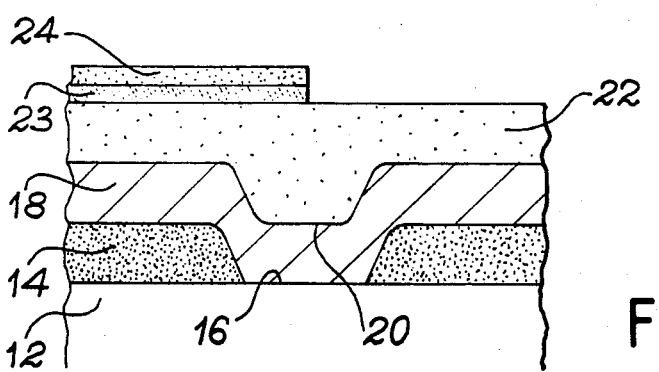

The following stage, shown in FIG. 3, consists of etching the coating of non-reflective material 23. This is preferably a reactive ionic etching process using $CHF_3$ if the material of the non-reflecting material coating 23 is $SiO_2$.

Figure 4:
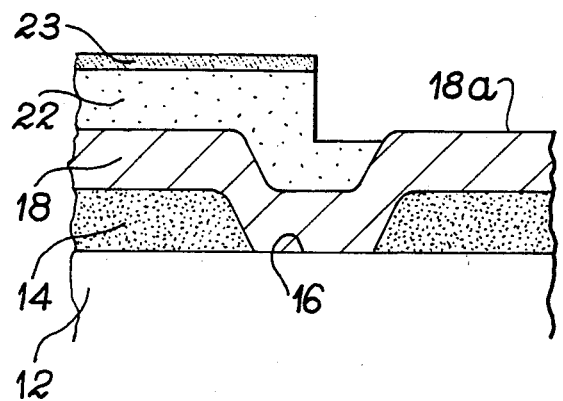

As shown in FIG. 4, the following stage of the process consists of etching that part of the resin coating 22 which is free from the non-reflecting material coating 23, whilst also eliminating residues of the photosensitive resin coating 24 left behind on the non-reflecting material coating 23.

The etching of this part of coating 22 only leaves behind insulant in that part where the electrical contact hole is located and in the parts protected by coating 23. For example, this etching process is of the dry type using an oxygen plasma.

Figure 5:
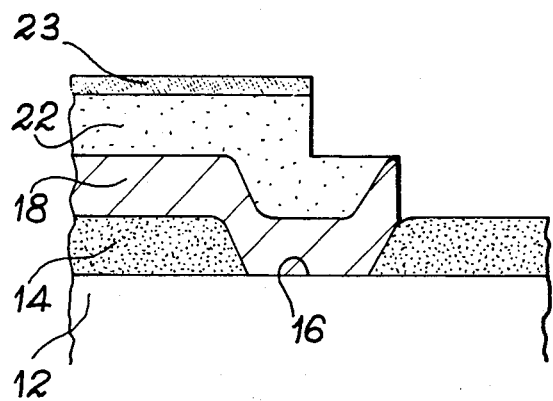

As shown in FIG. 5, the following stage of the positioning process consists of etching the part 18a of the conductive coating 18, which is free both of the non-reflecting material coating 23 and residues of the resin coating 22, the non-reflecting material coating 23 and the resin coating 22 serving as a mask for said etching process. The latter can be performed isotropically by chemical etching in a solution containing phosphoric acid $H_3PO_4$, in the case of an aluminium conductive coating 18. In the case of very small dimensions, preference is given to the use of an anisotropic etching process using a plasma consisting e.g. of compounds such as $CCl_4$.

The final stage of the process consists of eliminating the resin coating 22 and the non-reflecting material coating 23 which have been left behind. The residues of coating 23 can be eliminated by chemical etching with dilute HF if it is made from $SiO_2$. The resin coating 22 can be e.g. eliminated by e.g. an oxygen plasma.

Figure 6:
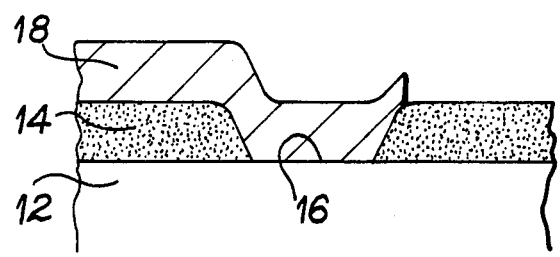

The structure obtained in shown in FIG. 6.

The aforementioned positioning process makes it possible to etch the interconnection line with high accuracy, because the image formed in the photosensitive resin 24 is very faithfully transferred into the intermediate coating of a non-reflecting material and then into the thick resin coating masking the etching of the conductive coating.

What is claimed is:

1. A process for the positioning of an interconnection line on an electrical contact hole of an integrated circuit, wherein, after producing the electrical contact hole, the following successive stages are performed:

deposition on the complete integrated circuit of a conductive coating, in which the interconnection line will be produced, deposition on the conductive coating of an insulating coating obliterating the relief thereof and having a planar surface, deposition of an intermediate coating of non-reflecting material on the insulating coating, deposition of a photosensitive resin coating on the intermediate coating and production of the image of the interconnection line to be produced in said resin coating, etching the non-reflecting, mask-free region of the material coating, elimination of the mask and etching the insulating coating of the regions not protected by the intermediate coating, the etching being stopped as soon as the region of the conductive coating located outside the contact hole is exposed, etching that part of the conductive coating free from the insulating coating, and elimination of the insulating coating and the remaining non-reflecting material.

2. A process according to claim 1, wherein the etching of the non-reflecting material coating is reactive ionic etching.

3. A process according to claim 1, wherein the non-reflecting material coating is of silica.

4. A process according to claim 1, wherein the non-reflecting material coating is of amorphous silicon.

5. A process according to claim 1, wherein the elimination of the mask and the etching of the insulating coating are carried out by means of oxygen-based reactive ionic etching.

* * * * *